(12) United States Patent
Odenberg et al.

(10) Patent No.: US 6,366,469 B1
(45) Date of Patent: Apr. 2, 2002

(54) ELECTRICAL COMPONENT STACKING SYSTEM

(75) Inventors: Richard Odenberg, Spokane, WA (US); John A. Haynes, Coeur D'Alene, ID (US)

(73) Assignee: Transtector Systems, Inc., Hayden Lake, ID (US)

( * ) Notice: Subject to any disclaimer, the term of this patent is extended or adjusted under 35 U.S.C. 154(b) by 0 days.

(21) Appl. No.: 09/379,662

(22) Filed: Aug. 24, 1999

Related U.S. Application Data

(60) Provisional application No. 60/098,447, filed on Aug. 31, 1998.

(51) Int. Cl.⁷ ................................................ H01R 9/09
(52) U.S. Cl. ..................... 361/790; 361/111; 361/127
(58) Field of Search ............................... 361/735, 736, 361/738, 742–744, 790, 903, 111, 127

(56) References Cited

U.S. PATENT DOCUMENTS

| | | | |
|---|---|---|---|
| 5,457,593 A | 10/1995 | Glaser et al. ............... | 361/119 |
| 5,909,350 A | * 6/1999 | Anthony .................... | 361/118 |
| 5,969,953 A | * 10/1999 | Purdom et al. ............. | 361/790 |

FOREIGN PATENT DOCUMENTS

| | | | |
|---|---|---|---|
| DE | 86 04 554 U | 5/1986 | ............. H01T/4/06 |
| WO | PCT/US99/19900 | 8/1999 | |

* cited by examiner

Primary Examiner—Ronald W. Leja
(74) Attorney, Agent, or Firm—Fulwider Patton Lee & Utecht, LLP

(57) ABSTRACT

An electrical component assembly includes a first printed circuit board (PCB) having a plurality of first-PCB conductive paths communicating with the surface of the first PCB, the assembly also includes at least one additional PCB having a plurality of additional-PCB conductive paths communicating with the surface of the PCB, with the conductive paths located such that when the additional PCBs and the first PCB are positioned one on top of the other, the conductive paths of the PCBs are substantially aligned, the conductive paths being formed from solder-filled vias passing through the PCBs and electrically-conductive junction pads positioned on the surface of the PCBs. The assembly also includes a plurality of electrical circuit components, wherein each component is electrically connected to a conductive path of one of the PCBs at one end and to a conductive path of another of the PCBs at the other end, the assembly also includes a plurality of traces that connect conductive paths. In some assemblies the traces configure some of the electrical components in a series arrangement whereas in other assemblies the traces configure some of the electrical components in a parallel arrangement.

21 Claims, 16 Drawing Sheets

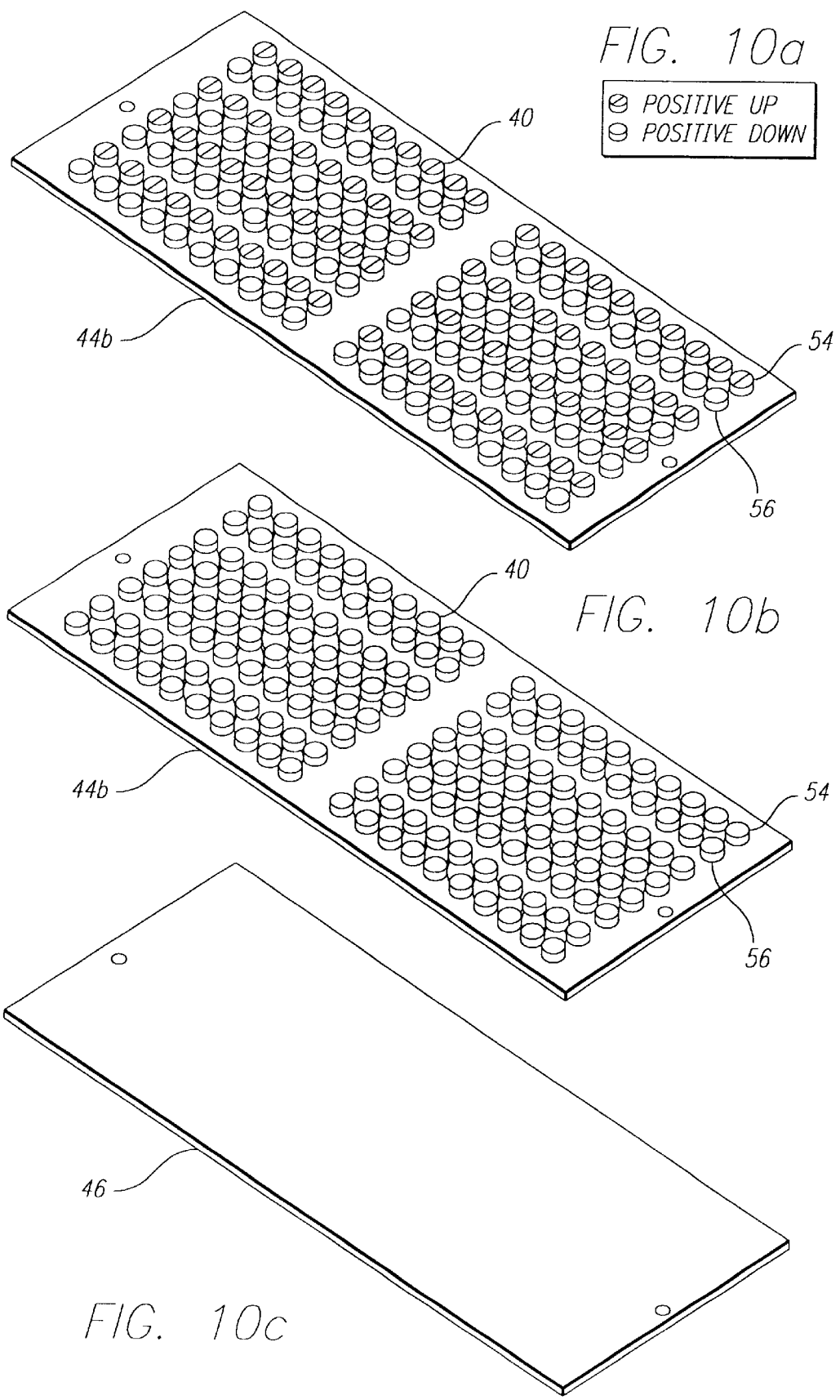

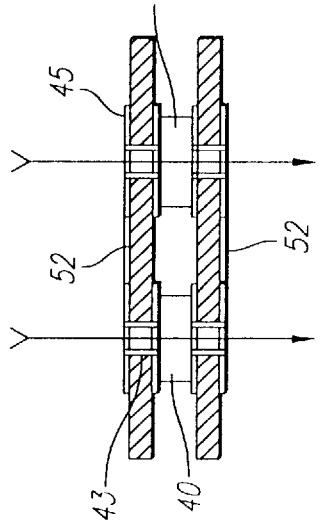
FIG. 13
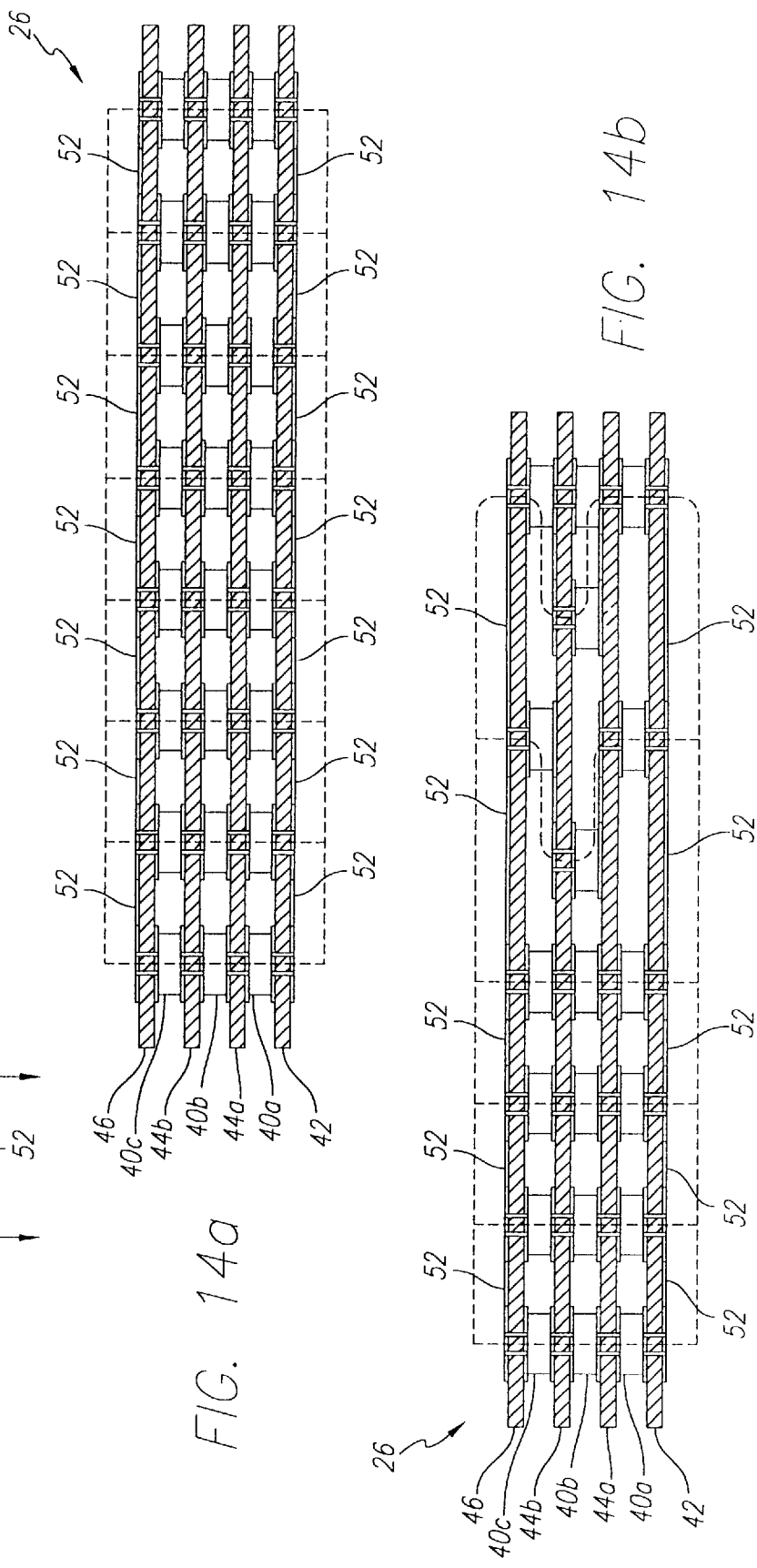
FIG. 14a
FIG. 14b

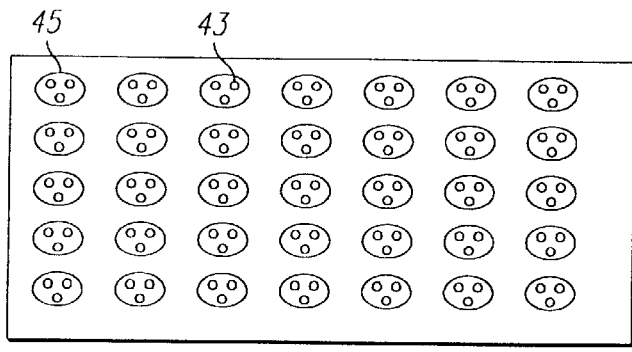
FIG. 15a
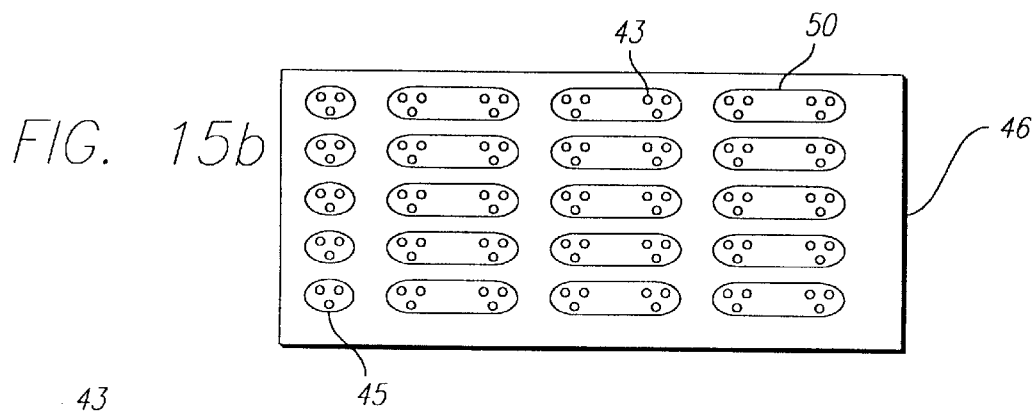
FIG. 15b
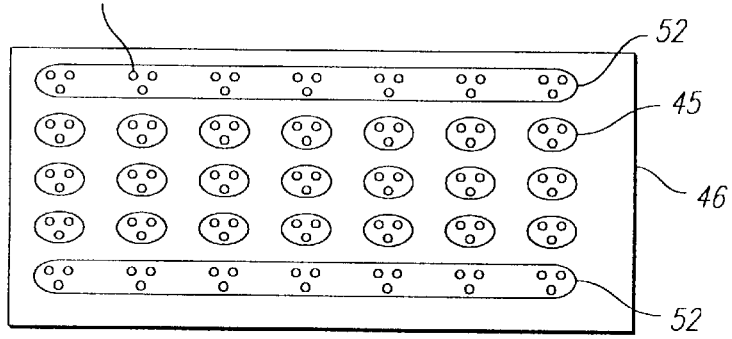
FIG. 15c
FIG. 16
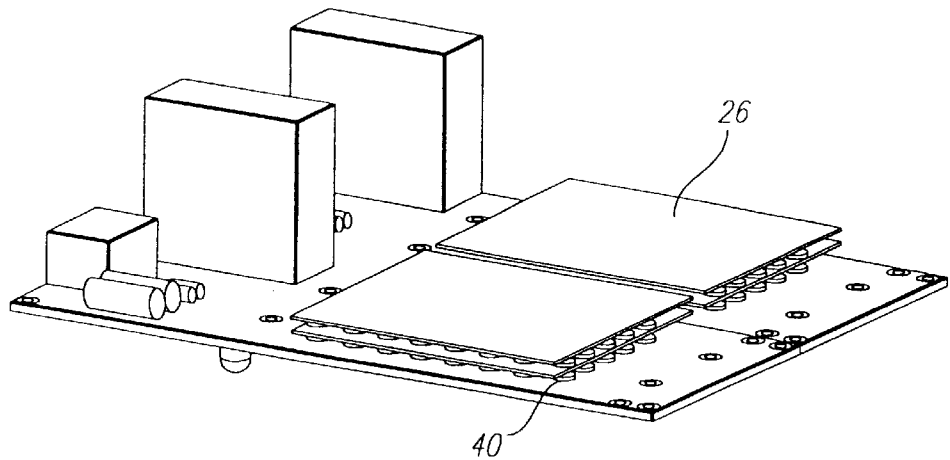

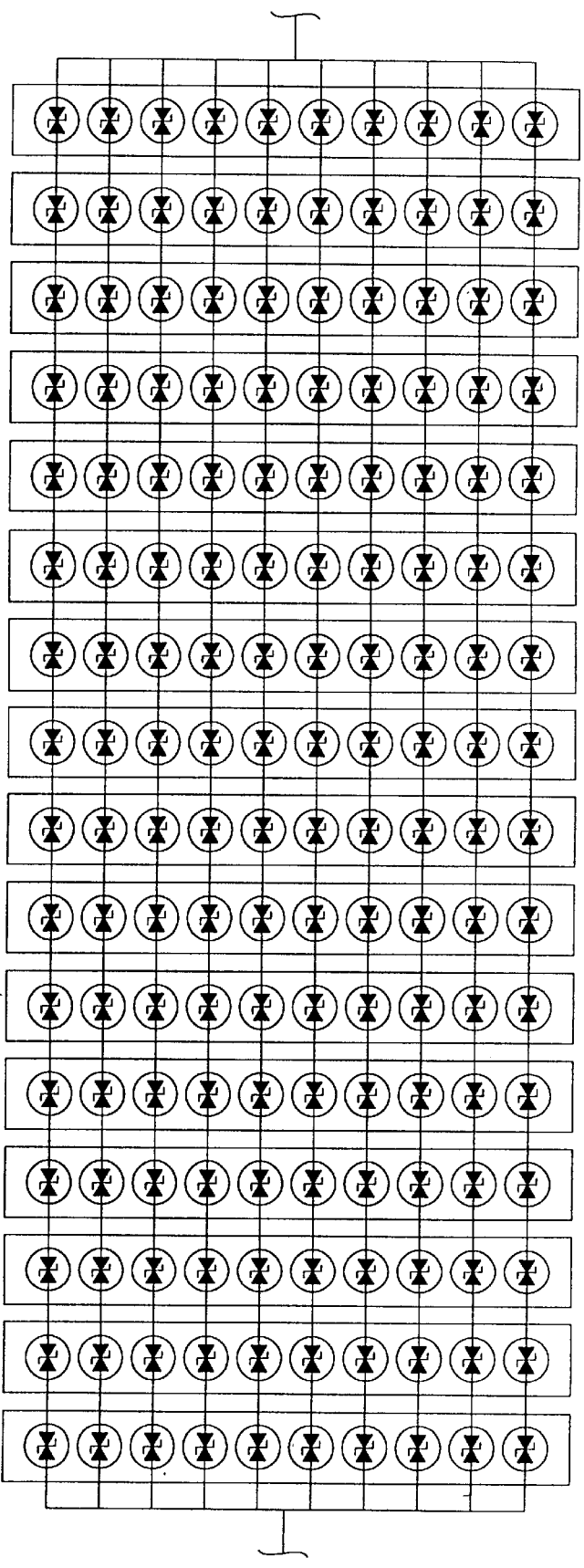
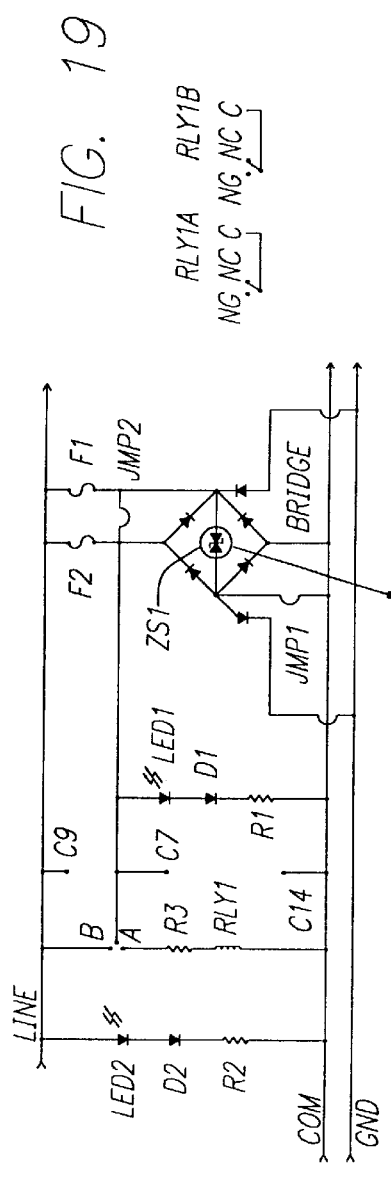
FIG. 19
FIG. 20

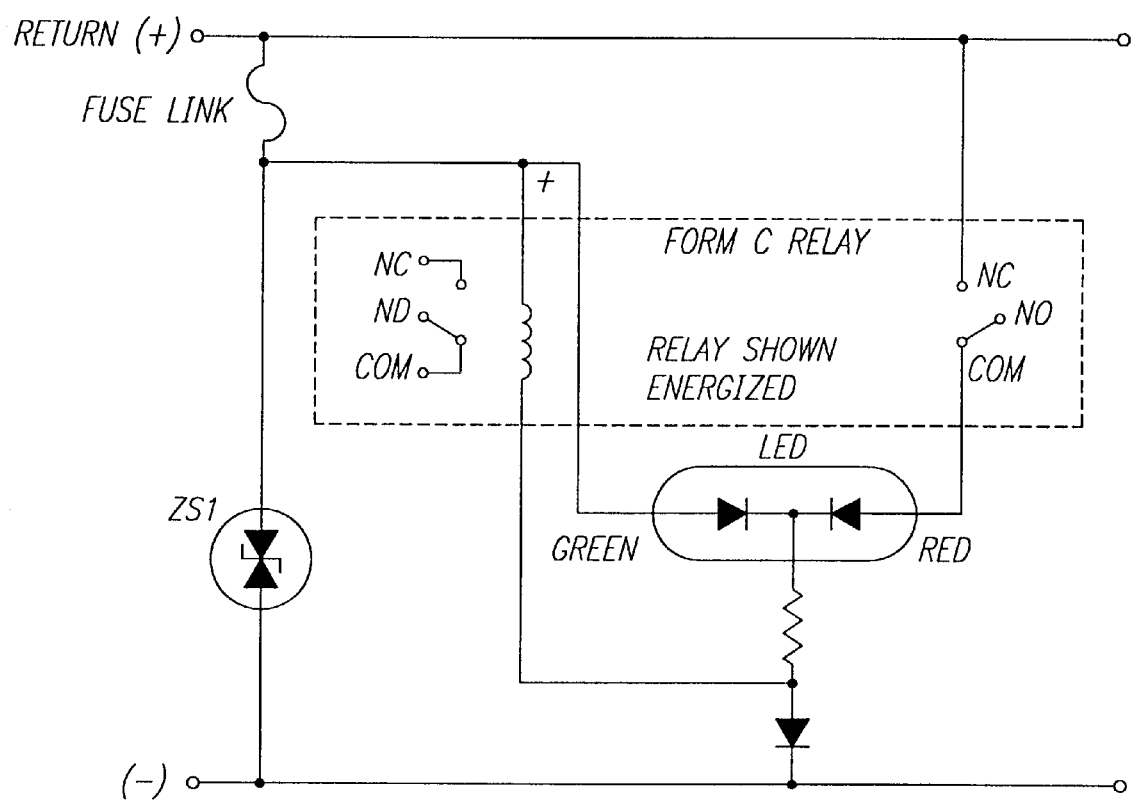

US 6,366,469 B1

ELECTRICAL COMPONENT STACKING SYSTEM

RELATED APPLICATIONS

This application is claiming the benefit of a co-pending provisional application Ser. No. 60/098,447, filed on Aug. 31, 1998.

BACKGROUND OF THE INVENTION

1. Field of the Invention

This invention relates generally to the field of electrical component integration and more particularly to systems for, and methods of, arranging and connecting electrical components to be used in electrical systems such as surge protective devices (SPDs).

2. Description of Related Art

Discrete electrical components are typically integrated into an electrical system by means of a printed wiring board (PCB). Components are mounted to a PCB using well known methods such as surface mounted technology and general feedthrough technology.

Some electrical systems, such as surge protective devices (SPDs) for use in power and signaling systems, require a large number of electrical components, particularly diodes, in order to provide the voltage, clamp range and energy suppression typically required by such systems. The large number of diodes renders PCB layout design difficult for several reasons. First, the large number of discrete components laid out on the PCB produces a cumulatively large lead length within the circuit formed by the interconnection of the discrete components. A large lead length may have a detrimental effect on the operational characteristics of the circuit.

Second, a PCB having a large number of individually mounted discrete components is typically structurally unstable in that the individually mounted components may become disconnected from the PCB. This is especially true for a PCB which is part of a module card that is often removed from and reinstalled into an electrical system.

Third, depending on the physical constraints of the electrical system being designed, limitations may be placed on the size of a PCB. A size limitation on the PCB, in turn limits the number of discrete components that may be mounted on the PCB and thereby limits the functional capabilities of the circuitry on the PCB.

Hence, those concerned with the development and use of electrical component assemblies have long recognized the need for component assemblies which are relatively compact, structurally sturdy, have minimum lead length between components and are configured to provide multiple paths, thus allowing for a multitude of electronic operating characteristics and functions. The present invention fulfills these needs and others.

SUMMARY OF THE INVENTION

Briefly, and in general terms, the present invention provides a system for arranging and connecting components used in surge protective devices (SPDs) and the like. The system provides a sturdy matrix array of electrical components having minimal lead lengths and the ability to provide multiple conductive paths, thus allowing for custom circuit design based on desired electronic operating characteristics and functions.

By way of example, and not necessarily by way of limitation, the present invention in one aspect provides an electrical component assembly having a first printed circuit board PCB) having a plurality of first-PCB conductive paths communicating with at least one surface of the first PCB. The assembly also has at least one additional PCB having a plurality of additional-PCB conductive paths communicating with at least one surface of the additional PCB. The first-PCB conductive paths and additional-PCB conductive paths are located such that when the additional PCB and the first PCB are positioned so that one PCB overlies the other, the first-PCB conductive paths and the additional-PCB conductive paths are substantially aligned. The assembly also includes a plurality of electrical circuit components, each electrically connected to one of either of the first-PCB conductive paths and the additional-PCB conductive paths at one end and to another of either of the first-PCB conductive paths and the additional-PCB conductive paths at the other end. The assembly further includes at least one trace conductive path connecting at least two of either of the first-PCB conductive paths and the additional-PCB conductive paths Thus the present invention substantially reduces the amount of wire leads within a circuit assembly by creating a unique arrangement of conductive paths, carried by the PCB, that functions as electrical junctions between components. The conductive paths also provide a bonding surface which enhances functional rigidity and electrical performance. The invention also creates a unique circuit configuration in utilizing PCB designs to create a matrix array. The invention creates an electrical junction between discrete components by bonding the components, surface to surface, using solder bonds and the PCB, itself, as a junction carrier. These conductive paths allow for parallel or series configurations in design.

In a more detailed facet, the first-PCB conductive paths and the additional-PCB conductive paths include at least one solder-filled via passing through the PCB. In another facet, the first-PCB conductive paths and the additional-PCB conductive paths further include at least one electrically-conductive junction pad communicating with the solder-filled via. The junction pad is positioned at the surface of the PCB. In still another aspect, the junction pad is substantially flush with the PCB. In yet another facet, the trace conductive path is carried on the surface of the PCB.

In a second aspect, the invention provides a SPD for electrical circuitry. The device includes first and second terminals for connection to the power and/or signal terminals of a circuit being protected. The device also includes a first printed circuit board (PCB) having a plurality of first-PCB conductive paths communicating with the surface of the first PCB and at least one additional PCB having a plurality of additional-PCB conductive paths communicating with the surface of the additional PCB. The first-PCB conductive paths and the additional-PCB conductive paths are located such that when the additional PCB and the first PCB are positioned so that one PCB overlies the other, the first-PCB conductive paths and the additional-PCB conductive paths are substantially aligned. The device also includes a plurality of electrical circuit components, each electrically connected to one of either of the first PCB conductive paths and the additional-PCB conductive paths at one end and to another of the first-PCB conductive paths and the additional-PCB conductive paths at the other end. The device further includes a plurality of trace conductive paths connecting selected first-PCB conductive paths and additional-PCB conductive paths, the first-PCB conductive paths, additional-PCB conductive paths and trace conductive paths connect the electrical circuit components to provide a means for clamping the voltage across the first and second terminals to a characteristic voltage when energized. The electrical components also provide an energizing circuit having a predetermined voltage threshold of conduction.

In a third aspect, the invention provides a SPD coupled between power lines and/or signal circuits. The device includes a first printed circuit board (PCB) having a plurality of first-PCB conductive paths communicating with the surface of the first PCB. Also included is at least one additional PCB having a plurality of additional-PCB conductive paths flush with the surface of the additional PCB. The first-PCB conductive paths and the additional-PCB conductive paths are located such that when the additional PCBs and the first PCB are positioned so that one PCB overlies the other, the first-PCB conductive paths and the additional-PCB conductive paths are substantially aligned. The device also includes a plurality of electrical circuit components, each electrically connected to one of either of the first-PCB conductive paths and the additional-PCB conductive paths at one end and to another of either of the first-PCB conductive paths and the additional-PCB conductive paths at the other end. Also included is a plurality of trace conductive paths connecting select first-PCB conductive paths and additional-PCB conductive paths. The first-PCB conductive paths, additional-PCB conductive paths and trace conductive paths connect the electrical circuit components to provide a means for clamping the voltage across said power line and neutral line to a predetermined voltage.

These and other features and advantages of the invention will become apparent from the following detailed description, taken in conjunction with the accompanying drawing, which illustrate by way of example the features of the invention.

BRIEF DESCRIPTION OF THE DRAWINGS

FIG. 10a is an isometric view of a mid-layer PCB subassembly which, in combination with the main PCB subassembly of FIG. 8a and the first-layer PCB subassembly of FIG. 9 forms a portion of the suppressor assemblies of FIG. 5, depicting the arrangement of and orientation of unipolar suppressor cells;

FIG. 10b is an isometric view of a mid-layer PCB subassembly which, in combination with the main PCB subassembly of FIG. 8b and the first-layer PCB subassembly of FIG. 9 forms a portion of the suppressor assemblies of FIG. 5, depicting the arrangement of bipolar suppressor cells;

FIG. 10c is an isometric view of a cap PCB which, in combination with the main PCB subassembly of FIG. 8a or 8b, the first-layer PCB subassembly of FIG. 9a or 9b and the mid-layer PCB subassembly of FIG. 10a or 10b forms the suppressor assemblies of FIG. 5;

FIG. 13 depicts two suppressor cells positioned between two PCBs and connected in parallel;

FIGS. 14a and 14b are side views of two of many possible configurations of the suppressor assemblies of FIG. 5 having two mid-layer PCB subassemblies and one cap PCB with a plurality of suppressor cells positioned between the PCBs and adjacent stacks of suppressor cells connected in parallel;

FIG. 15a is a plan view of a mid-layer PCB depicting a plurality of junction pads and solder junctions onto which suppressor cells are attached;

FIG. 15b is a plan view of a cap PCB depicting a plurality of junction pads onto which suppressor cells are attached and a plurality of trace paths between adjacent junction pads so as to provide a series connection across each row of suppressor cells;

FIG. 15c is a plan view of a cap PCB depicting a plurality of junction pads onto which suppressor cells are attached and a plurality of trace paths across the rows of junction pads so as to provide a parallel connection across adjacent columns of suppressor cells;

FIG. 16 is an isometric view of a PCB assembly depicting circuit components including two suppressor assemblies mounted parallel to the PCB;

FIG. 19 is a schematic of the PCB assembly of FIG. 18;

FIG. 20 is a detailed schematic of the suppressor assembly ZS1 of FIG. 19;

FIG. 24 is a schematic of a dc surge suppressor circuit which incorporates a suppressor assembly configured in accordance with the present invention.

DETAILED DESCRIPTION OF THE PREFERRED EMBODIMENTS

Figure 1:
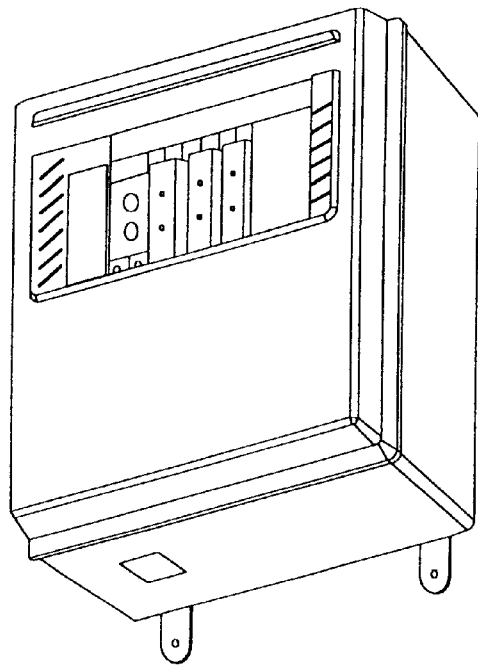
FIG. 1 is an isometric view of a three-phase surge protective device including three surge protective modules configured in accordance with the present invention.
Figure 2:
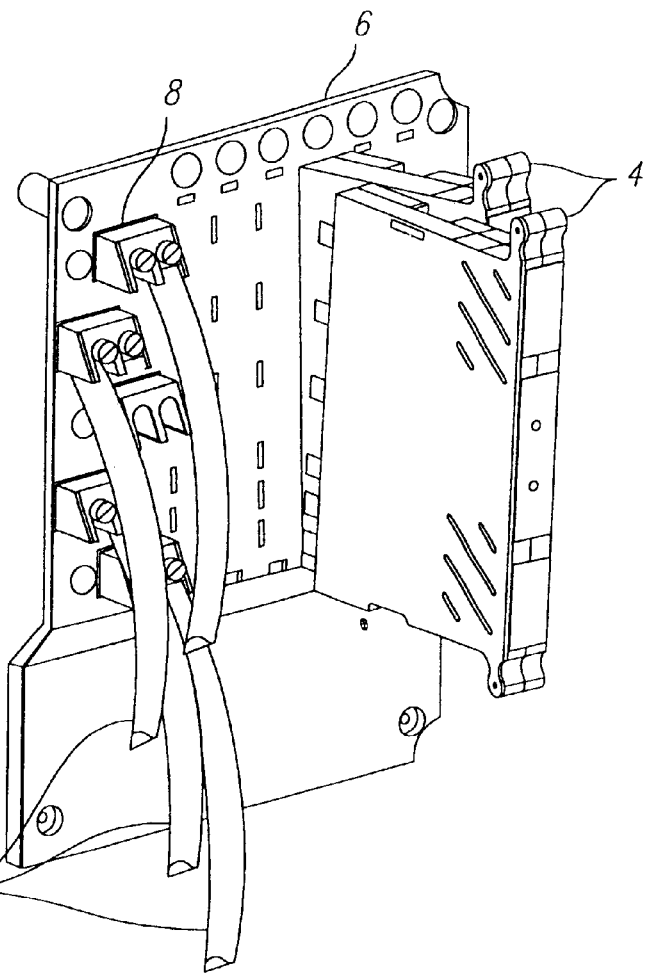
FIG. 2 is an isometric view of the interior of the surge protective device of FIG. 1 illustrating two surge protective modules or "cards", one installed and the other removed.

Referring now to the drawings, wherein like reference numerals denote like or corresponding parts throughout the drawing figures, an surge protective device (SPD) 2 incorporating surge protective modules configured in accordance with the present invention is shown in FIG. 1. As best observed in FIGS. 2 and 3, the interior of the surge protective device 2 reveals a plurality of surge protective modules (SPMs) 4. The SPMs 4 are modular cards which may be installed into and removed from a back panel 6. The back panel 6 also provides a plurality of lugs 8 for hook up of one, two or three phase lines, a neutral line and a ground line.

Figure 4:
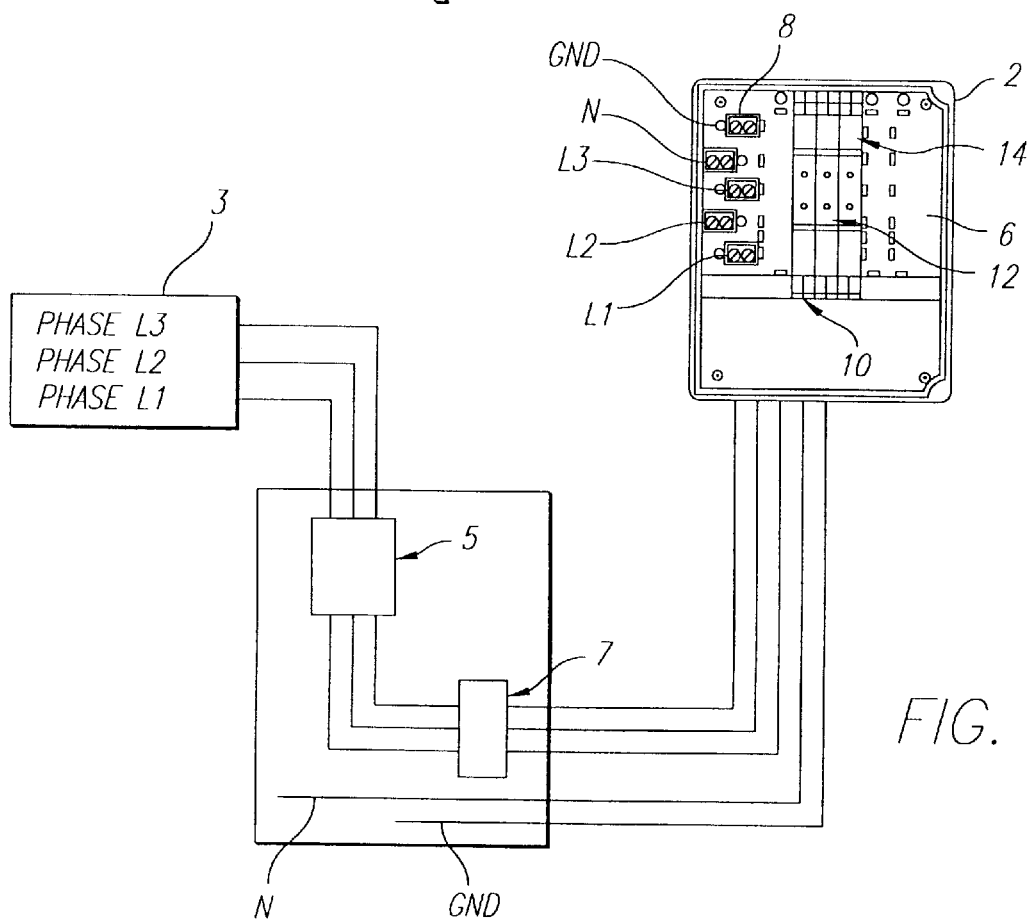
FIG. 4 is a block diagram illustrating the interconnection between the surge protective device of FIG. 1 and a power source.

With reference to FIG. 4, a three-phase SPD 2 is shown connected to a three-phase power source 3. A phase 1 surge protective module 10, a phase 2 surge protective module 12, and a phase 3 surge protective module 14 are installed in their respective slots on the back panel 6. The three phase lines L1, L2, and L3 of the power source 3 are connected to the phase L1, L2, and L3 lugs 8 respectively through a disconnect/main breaker 5 and a disconnect 7. The ground GND and neutral N lines are connected to an external ground GND and neutral N.

Figure 3:
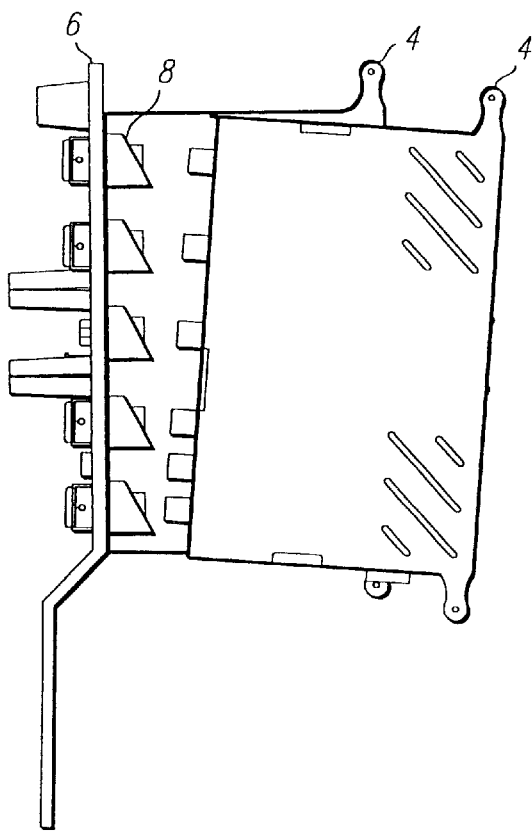
FIG. 3 is a side view of the surge protective modules of FIG. 2.
Figure 5:
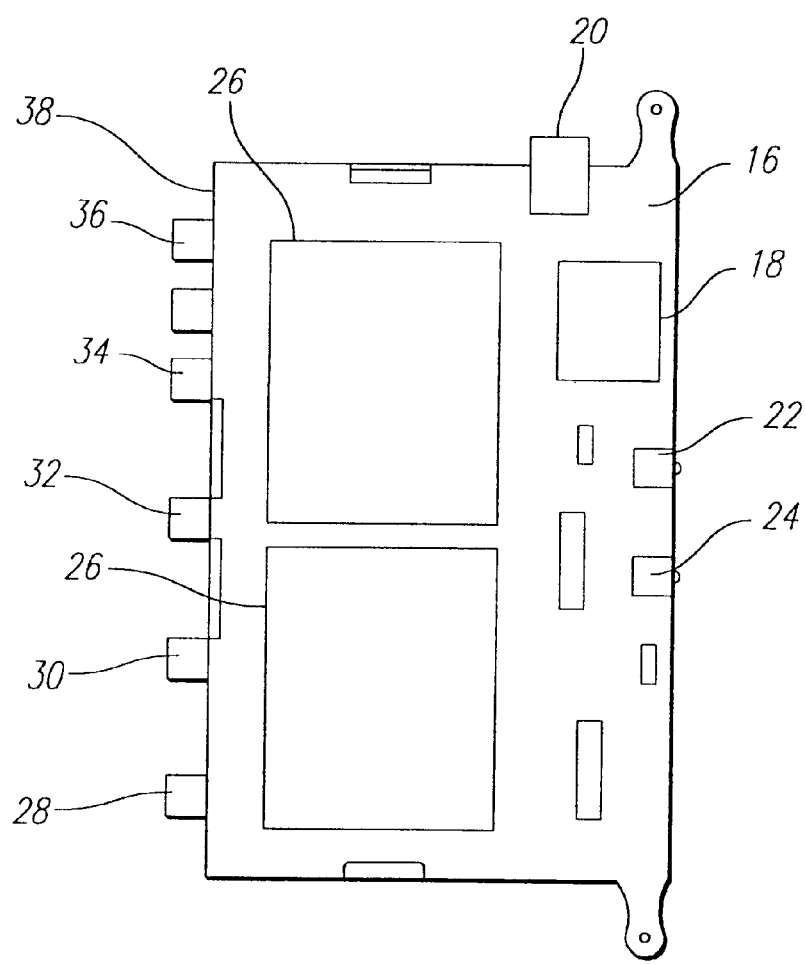
FIG. 5 is a plan view of an exemplary interior of the surge protective modules of FIGS. 2, 3, and 4, showing the general layout of suppressor assemblies and other circuit components on a main PCB.

The interior of each of the SPMs 10, 12, 14, as shown in FIG. 5, includes a "main" or "bottom" printed circuit board (PCB) 16. Mounted on the main PCB are a relay 18, a relay 3-pin plug 20, a green LED 22, a red LED 24, two suppressor assemblies 26 and various other components. Extending from the PCB are a ground pin 28, a neutral pin 30, a line-3 pin 32, a line-2 pin 34 and a line-1 pin 36. These pins extend through the rear of the cards housing 38 and provide for the interconnection between the cards and the back panel 6 (FIG. 3).

Depending on the design of the SPMs 10, 12, 14, the operating characteristics of the SPD 2 may vary. For example, different suppressor assemblies 26 designs may provide different voltage, clamp range and energy suppression capabilities to an electric panel box 2. SPM 10, 12, 14 components, including suppressor assemblies 26, can be of varying sizes and shapes defined by circuitry requirements. Thus, the overall size of a SPM can change due to packaging and performance requirements. In one exemplary configuration, as shown in FIG. 6a, the SPMs 10, 12, 14, include the circuitry listed below.

| Ref. Des. | Component |
| --- | --- |
| B1 | Discrete bridge |
| D1 | blocking diode |
| D7 | blocking diode |
| F1 | fuse link |
| D5 | LED |
| D3 | LED |
| R3 | resistor |
| R2 | resistor |
| ZS1 | Unipolar suppressor cells in series and in parallel |
| ZS2 | Unipolar suppressor cells in series and in parallel |
| RLY1 | Relay |
| J1-14 | Jumper, phase select |

Figure 6A:
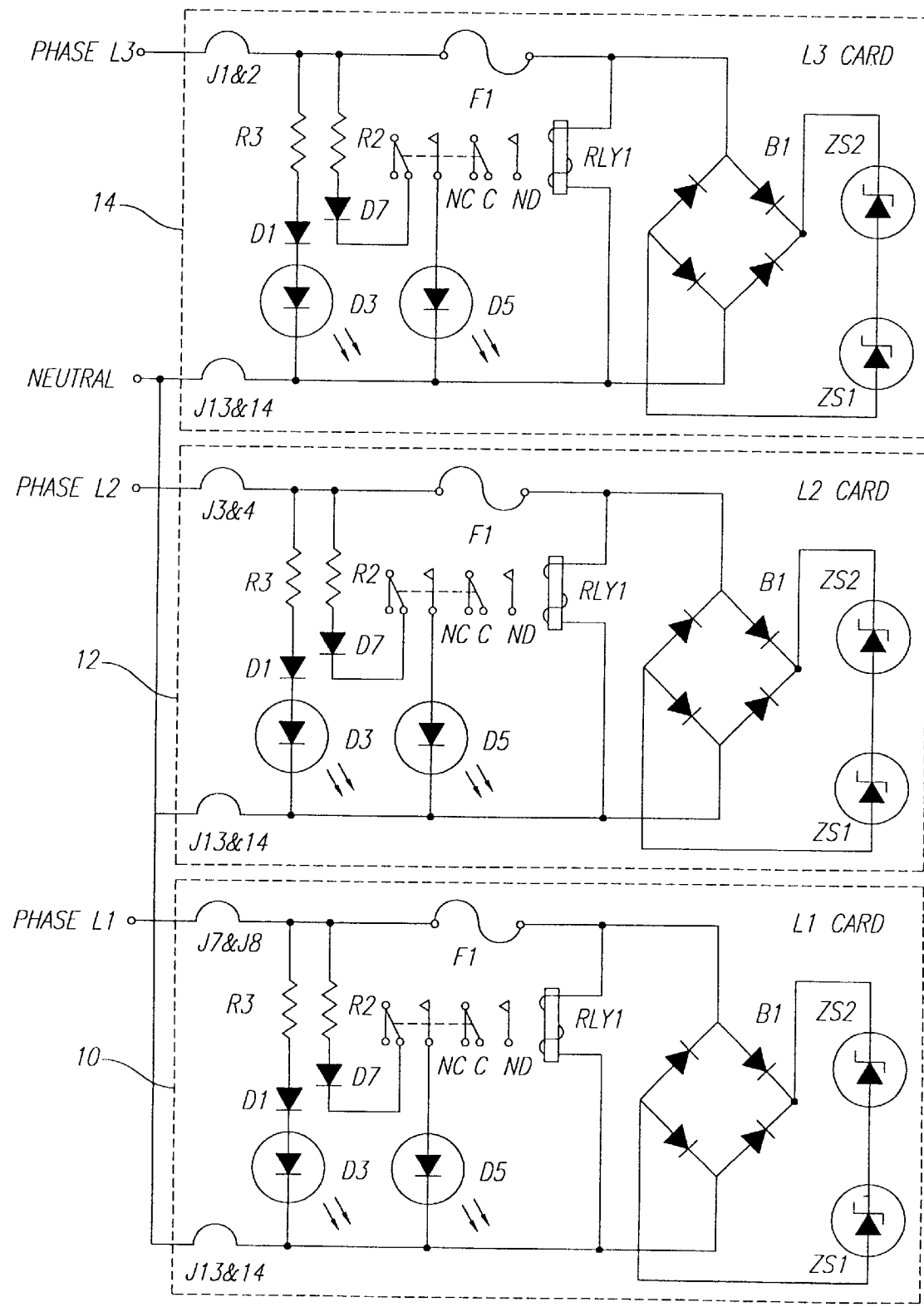
FIG. 6a is a schematic diagram of the three surge protective cards of FIG. 4 configured as a bridge suppressor including two suppressor assemblies in series comprising unipolar suppressor cells.
Figure 6B:
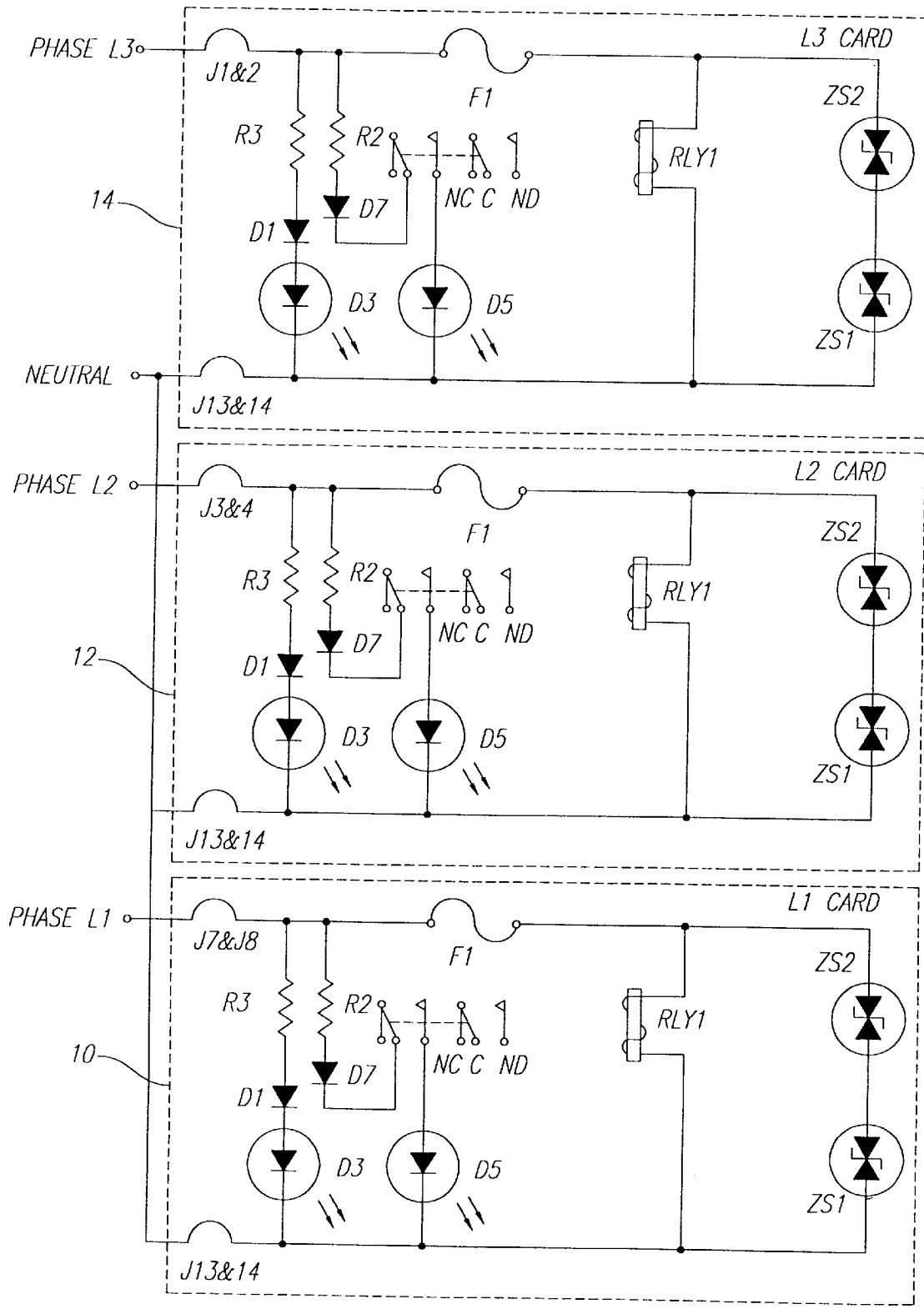
FIG. 6b is a schematic diagram of the three surge protective cards of FIG. 4 including two suppressor assemblies in series comprising bipolar suppressor cells.

In another exemplary configuration, as shown in FIG. 6b, the SPMs 10, 12, 14, include circuitry similar to that listed for FIG. 6a except that ZS1 and ZS2 comprise bipolar suppressor cells in series and in parallel and the discrete bridge B1 is eliminated. These configurations maybe used in 120V single-phase or three-phase power systems.

Figure 7:
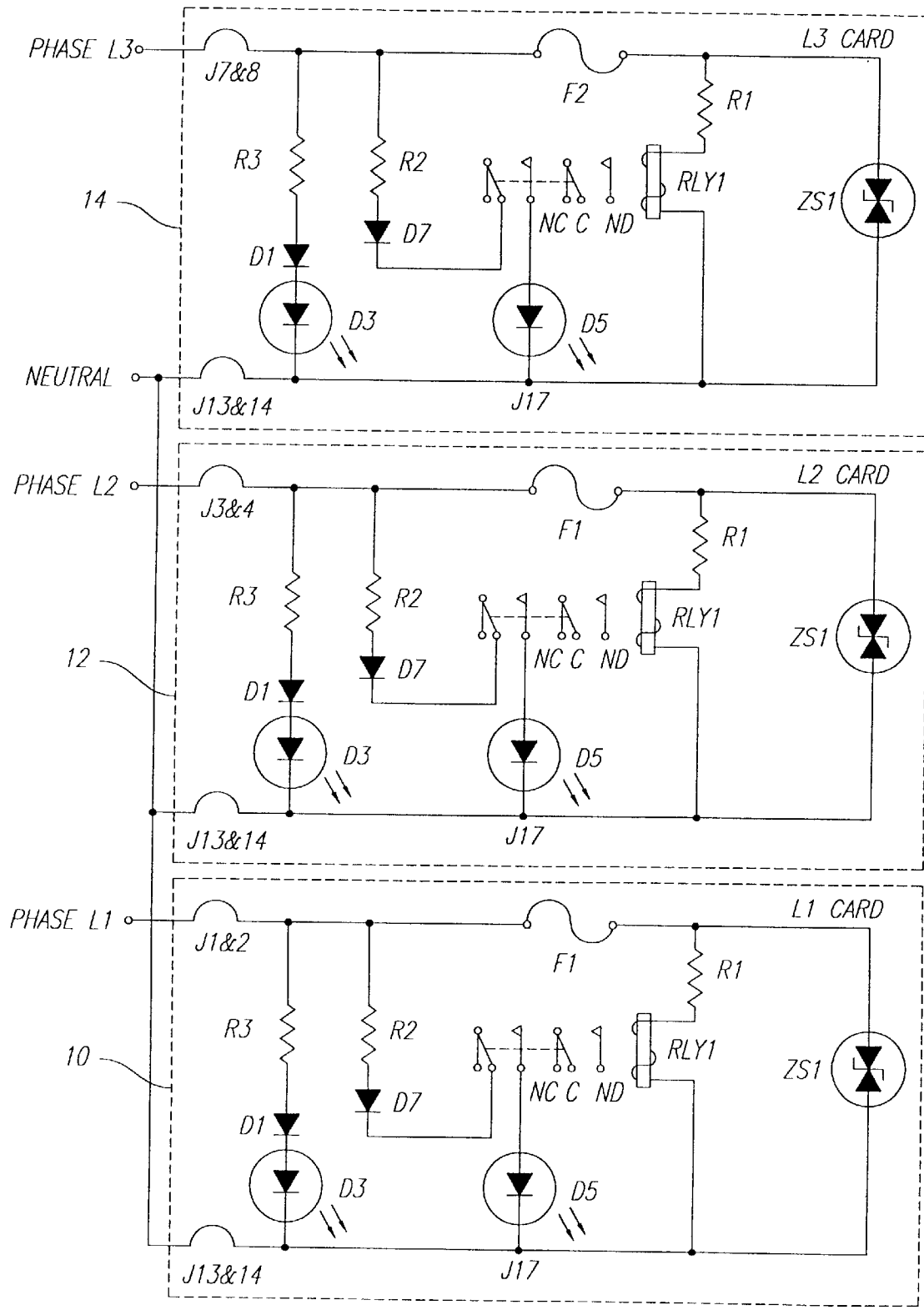
FIG. 7 is a schematic diagram of the three surge protective cards of FIG. 4 including a suppressor assembly comprising bipolar suppressor cells.

In another exemplary configuration, as shown in FIG. 7, the SPMs 10, 12, 14, include the circuitry listed below.

| Ref. Des. | Component |
| --- | --- |
| D1 | blocking diode |
| D7 | blocking diode |
| F1,2 | fuse link |
| D5 | LED |
| D3 | LED |
| R3 | resistor |
| R2 | resistor |
| R1 | resistor |
| ZS1 | Bipolar suppressor cells in series and in parallel |
| RLY1 | Relay |
| J1-14 | Jumper, phase select |
| J17 | Jumper, neutral/ground select |

This configuration is used in a three-phase power system.

Figure 17:
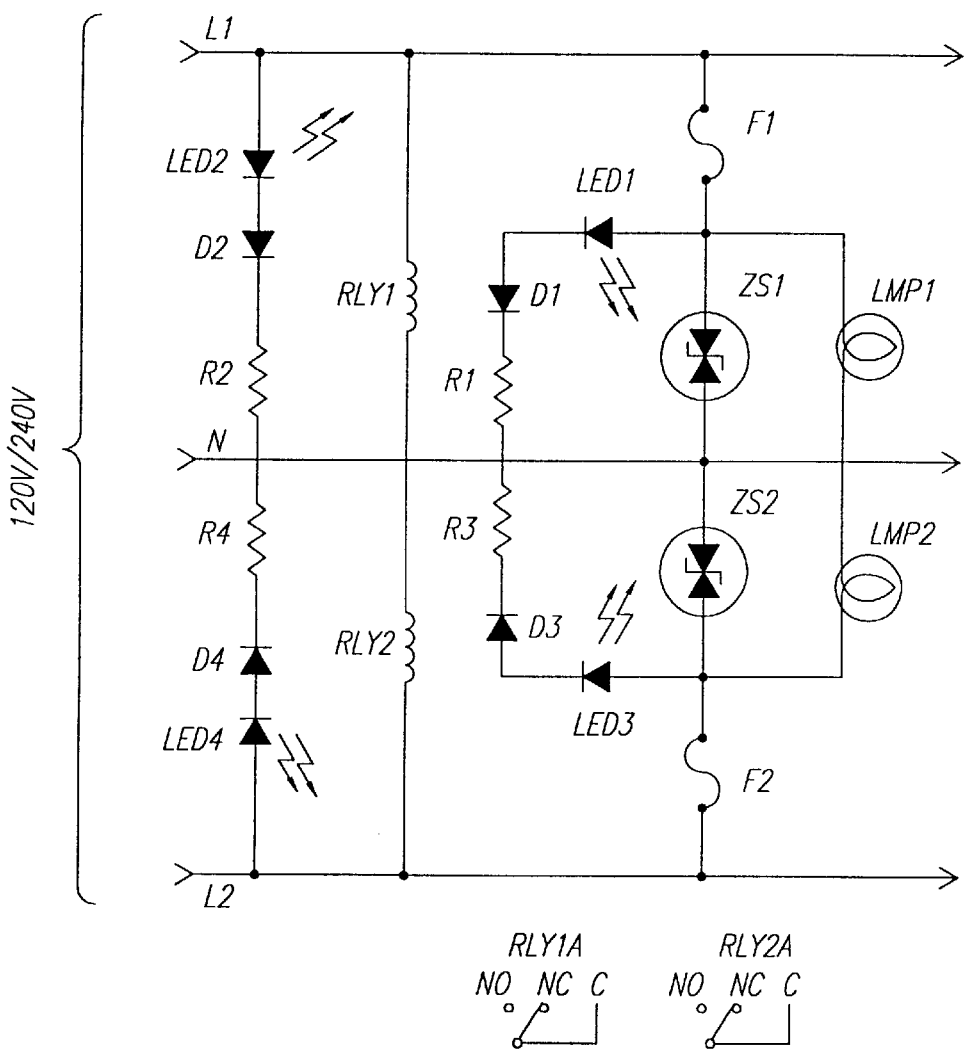
FIG. 17 is a schematic of the PCB assembly of FIG. 16 including two suppressor assemblies comprising bipolar suppressor cells.

In yet another exemplary configuration, as shown in FIG. 17, a SPM includes the circuitry listed below.

| Ref. Des. | Component |
| --- | --- |
| F1,2 | Fuse links |
| D1-4 | Rectifier diode |
| R1-4 | Resistor |
| LED1,3 | LED |
| LED2,4 | LED |
| ZS1,2 | Bipolar suppressor cells in series and in parallel |
| RLY1,2 | Relay |
| LMP1,2 | Lamp |

This configuration is used in a 120V/240V single-phase, three-wire system.

In each of the exemplary configurations depicted in FIGS. 6a, 6b, 7 and 17 the suppressor assemblies are represented schematically as including diode suppressor cells. Suppressor cells may, however, encompass other circuit technology such as metaloxide varistors (MOVs). In addition, suppressor assemblies may also include filtering features provided by other circuit technology such as capacitors.

In accordance with the present invention, the operating characteristics, e.g., voltage, clamp range, suppression capabilities, of the SPMs 10, 12, 14, are obtained using unique circuit board component stacking technologies which allow for a multitude of suppressor designs. In general, the SPMs 10, 12, 14 are comprised of several PCB subassemblies which are individually manufactured and later assembled, in a stacked layer fashion as shown for example, in FIG. 16, to produce a suppressor assembly 26. Mounted on the subassemblies and positioned between the layers of an assembly are suppressor cells 40, e.g. diodes MOVs, capacitors, etc. The stacked portion of the SPMs 10, 12, 14 form the suppressor assemblies 26.

The pattern of each PCB defines a routing of electrical connection that allows suppressor cells 40 to be vertically stacked and bonded to the PCB in individual layers. With reference to FIGS. 15a–15c, traces 50, 52 i.e., electrical connections, are created using unique circuit board technologies. The PCBs 44a, 44b, 46 have through holes, i. e. vias 43, to allow for electrically conductive bonding agents to flow from one side of the PCB to the other. The PCBs 44a, 44b, 46 also have junction pads 45 that are strategically positioned for each suppressor design.

With reference to FIGS. 12a, 12b, 14a, 14b a multitude of vias 43 are formed through junction pads 45 located on the surface of the PCBs 42, 44a, 44b, 46. The vias 43 are then filled with solder. The combination of solder-filled vias and junction pads 45 create a conductive path through the PCB. Connection is made with a cell 40a, 40b, 40c with electrical surfaces parallel to the PCB conductive paths. The conductive paths are designed to carry the correct current required to maximize performance of the device. The arrangement of the cells 40a, 40b, 40c and interconnections are such as to create a tight matrix array.

Typically, a PCB 42, 44a, 44b, 46 is created with several unique vias 43, each communicating with a solid junction pad 45 on one or both sides of the PCB. Other traces 50, 52 are created at the surface of the PCB. During assembly of a PCB subassembly, a solder bonding agent is applied to the PCB to fill the vias 43 while a cell 40a, 40b, 40c is placed on top of the junction pad 45. This may be repeated for any number of PCBs. A cap PCB 46 and bottom PCB 42 complete the suppressor assembly 26. As explained in detail below, the combination of stacked cells, conductive paths and surface traces allow for parallel or series connections of cells which allow for a great variety of suppressor assembly 26 designs.

Figure 8A:
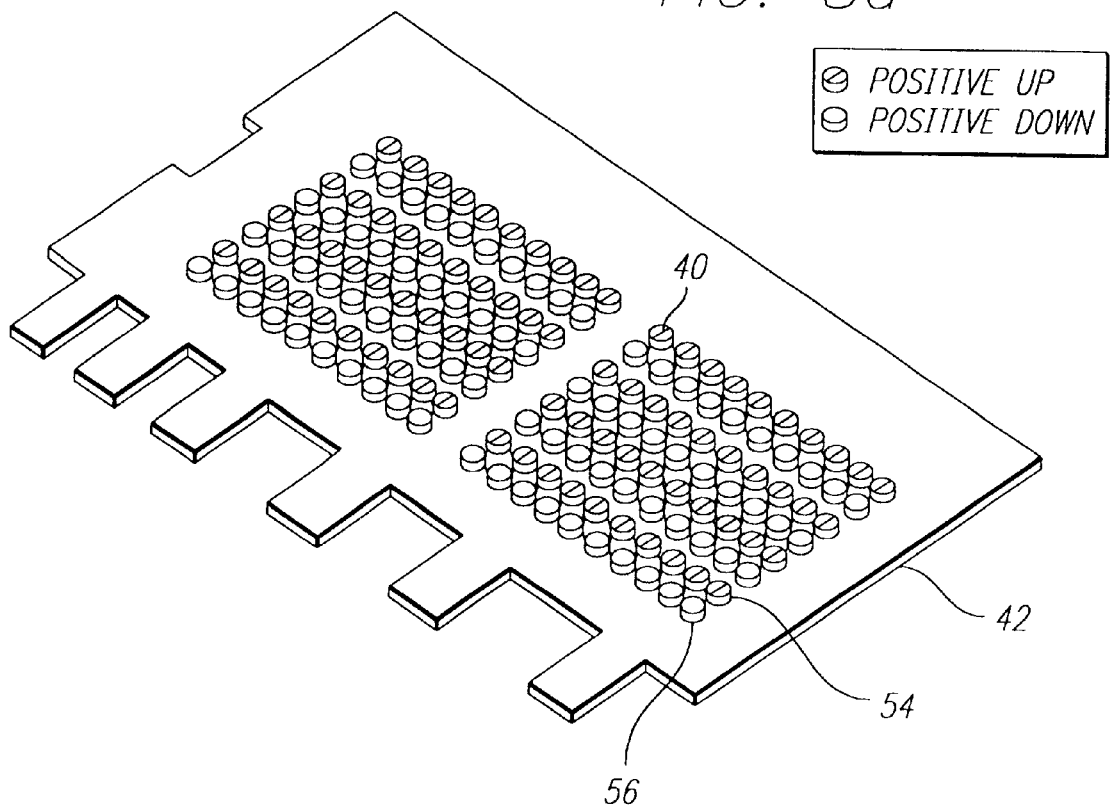
FIG. 8a is an isometric view of an exemplary main PCB subassembly as may be included in the surge protective module of FIG. 5, depicting the arrangement and orientation of unipolar suppressor cells, e.g., diodes.
Figure 8B:
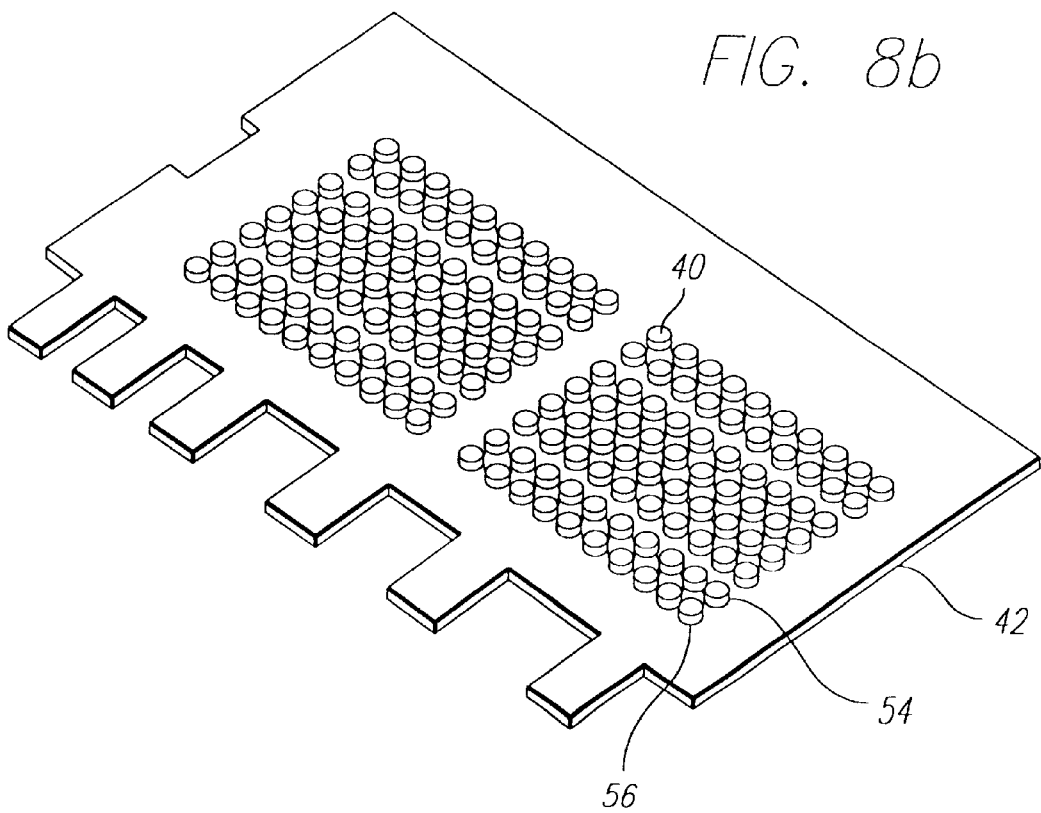
FIG. 8b is an isometric view of an exemplary main PCB subassembly as may be included in the surge protective module of FIG. 5, depicting the arrangement of bipolar suppressor cells, e. g. diodes.
Figure 9A:
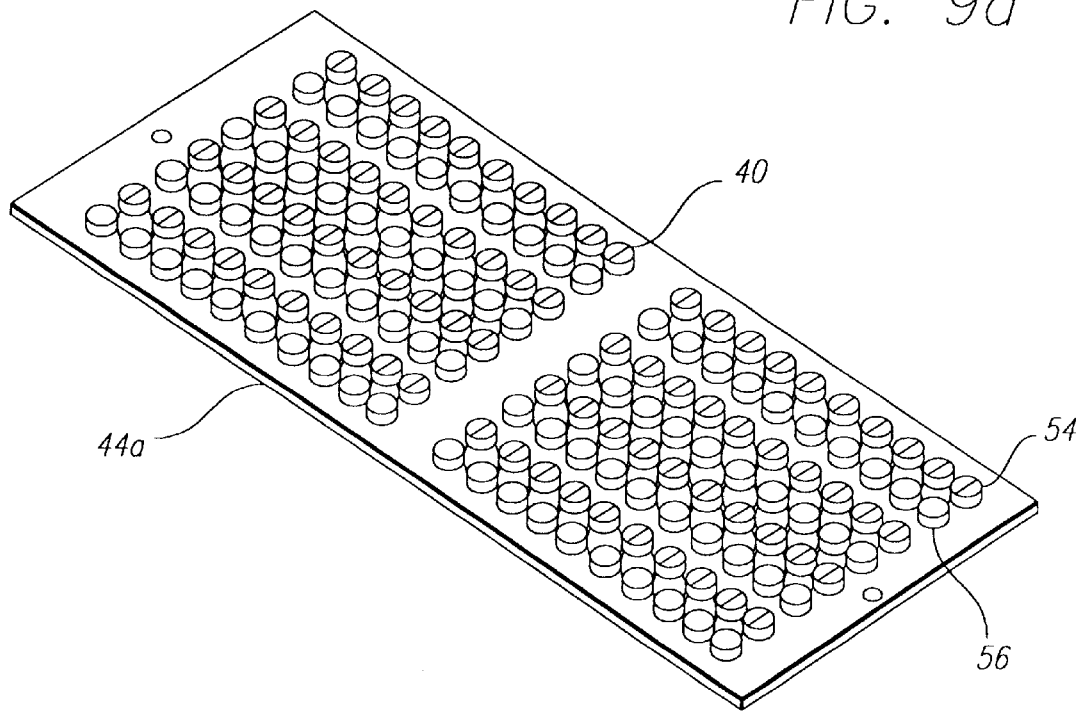
FIG. 9a is an isometric view of a first-layer PCB subassembly which in combination with the main PCB subassembly of FIG. 8a forms a portion of the suppressor assemblies of FIG. 5, depicting the arrangement and orientation of unipolar suppressor cells.
Figure 9B:
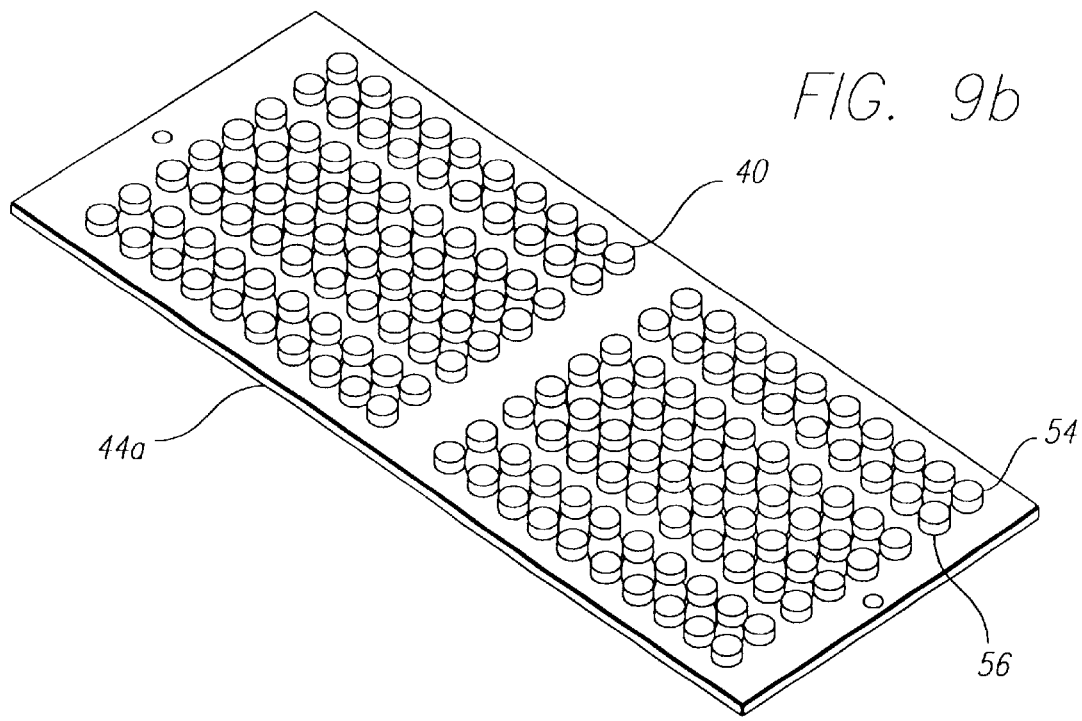
FIG. 9b is an isometric view of a first-layer PCB subassembly which in combination with the main PCB subassembly of FIG. 8b forms a portion of the suppressor assemblies of FIG. 5, depicting the arrangement of bipolar suppressor cells.

As shown in FIGS. 8a through 10b, and 23, the suppressor assemblies 26 may include individual rectifier and avalanche diode cells 40. These diodes may be unipolar or bipolar. For unipolar diodes, as shown in FIGS. 8a, 9a and 10a the diodes 40 may be oriented either positive side up 54, as indicated by those diodes with a line on top, or positive side down 56. As further shown in FIGS. 12a, 12b, 14a and 14b, a plurality of diode cells 40a, 40b, 40c, are stacked vertically between a plurality of PCBs 42, 44a, 44b, 46. The bottom surface of a first diode cell 40a is bonded to a junction pad 43 on the top surface of a bottom PCB 42 while the top of the diode is bonded to a junction pad on the bottom surface of a first mid-layer PCB 44a. In turn, the bottom surface of a second diode cell 40b is bonded to a junction pad 43 on the top of the first mid-layer PCB 44a while its top surface is bonded to junction pad on the bottom of a second mid-layer PCB 44b. Similarly, the bottom surface of a third diode cell 40c is bonded to junction pad 43 on the top of the second mid-layer PCB 44b while its top surface is bonded to a junction pad on the bottom of a top or "cap" PCB 46.

Figure 12A:
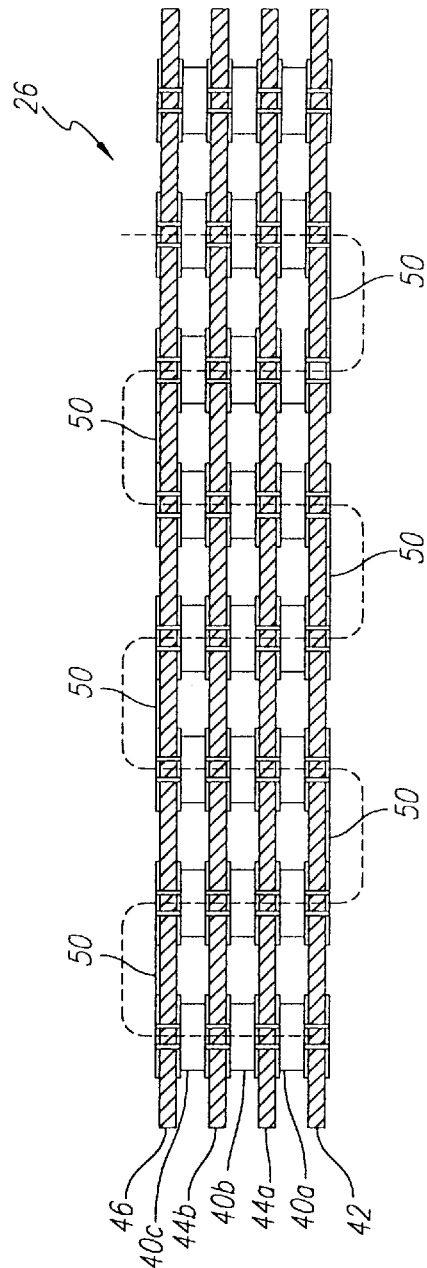
FIGS. 12a and 12b are side views of two of many possible configurations of the suppressor assemblies of FIG. 5 having two mid-layer PCB subassemblies and one cap PCB with a plurality of suppressor cells positioned between the PCBs and adjacent stacks of suppressor cells connected in series.
Figure 12B:
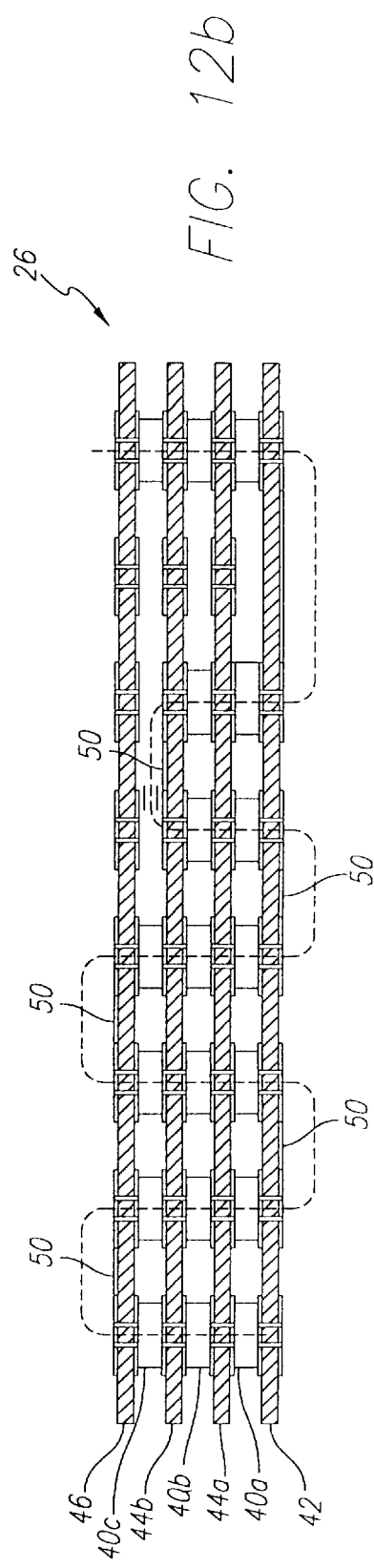

These diode cells 40a, 40b, 40c are strategically placed to form suppressor assemblies 26 of known performance in regard to voltage, clamp range and energy suppression. As indicated in FIGS. 12b and 13b, diodes 40a, 40b, and 40c need not be present in each column. The stacking of PCBs 42, 44a, 44b, 46 can be any number over two boards in height. Traces 50, 52 are used to connect stacks of diode cells 40 in either a series or parallel configuration to provide for customized voltage and energy levels. Other traces (not shown) are used to mount discrete components such as resistors, lights, relays, etc.

Figure 11:
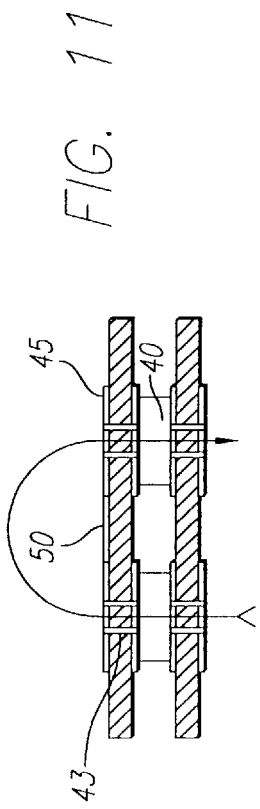
FIG. 11 depicts two suppressor cells positioned between two PCBs and connected in series.

A series trace 50, as shown in FIG. 11, connects adjacent diodes 40 in series. An arrangement of series traces 50 (FIGS. 12a and 12b) on the cap PCB 46, in combination with an arrangement of series traces 50 on the bottom PCB 42 may be staggered, relative to each other, to produce a series of diodes cells 40 as indicated by the dashed line through FIG. 12a. The series trace 50 may be arranged in order to produce a great variety of series arrangement of diode cells 40. An example of another arrangement is shown in FIG. 12b.

A parallel trace 52, as shown in FIG. 13, connects adjacent diodes 40 in parallel. A pair of parallel traces 52 on the cap PCB 46 such as shown in FIG. 15c, in combination with a pair of parallel traces on the bottom PCB 42 (FIG. 14a) produces a plurality of serially stacked diodes connected in parallel, as indicated by the dashed lines through FIGS. 14a and 14b.

Figure 18:
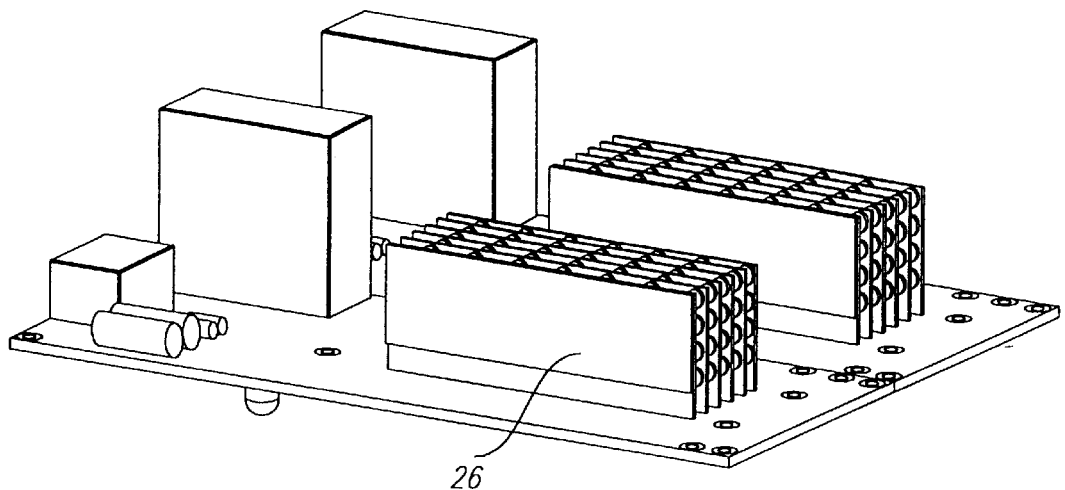
FIG. 18 is an isometric view of a PCB assembly depicting circuit components including two suppressor assemblies mounted perpendicular to the PCB.

FIGS. 8a through 10b illustrate various PCB subassemblies 42, 44a, 44b, 46. As previously mentioned, a subassembly is a PCB with components 40 stacked vertically and through-hole or surface-mount components installed as required. Theses subassemblies 42, 44a, 44b, 46 are manufactured using vertically mounted components in a defined pattern and are eventually assembled to form a PCB assembly, such as shown in FIGS. 16 and 18. As previously mentioned, components 40 may include diodes, MOVs, capacitors and other micro circuitry.

The subassemblies 42, 44a, 44b, 46 are assembled using surface mounting technologies. Assembly of the subassemblies 42, 44a, 44b, 46 requires a controlled manufacturing process including temperature, time, oven profiling and materials. The temperature requirements are defined by the material selected and the mass of the material. The temperature at which the oven operates is defined by the oven profile. An oven profile is defined as time in feet per minute and temperature per zone. In one theory of oven profile, the oven profile allows for solder reflow to occur after the thermal mass of the complete assembly raises above 190° C. Solder paste reflows at 185° C. In another theory, thermal transfer occurs over a long rise time to the innermost components. The time it takes to process a subassembly varies depending on the size of the suppressor assembly, the thermal mass and heat transfer to the innermost components of the stacked suppressor assembly.

Figure 21:
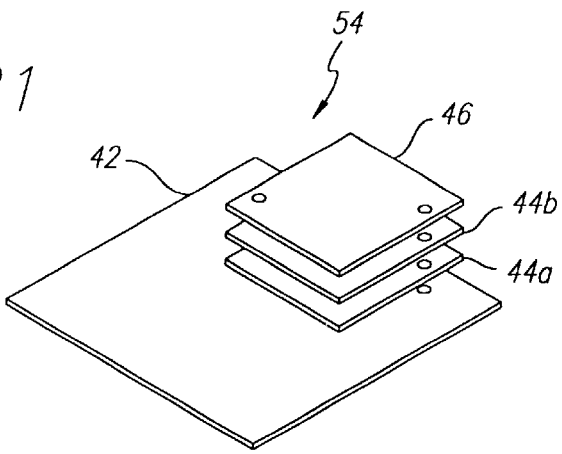
FIG. 21a is an isometric view of a first-layer PCB, a mid-layer PCB and a cap PCB in stacked arrangement on a main PCB, for clarity, the PCBs are shown without suppressor cells.
Figure 22:
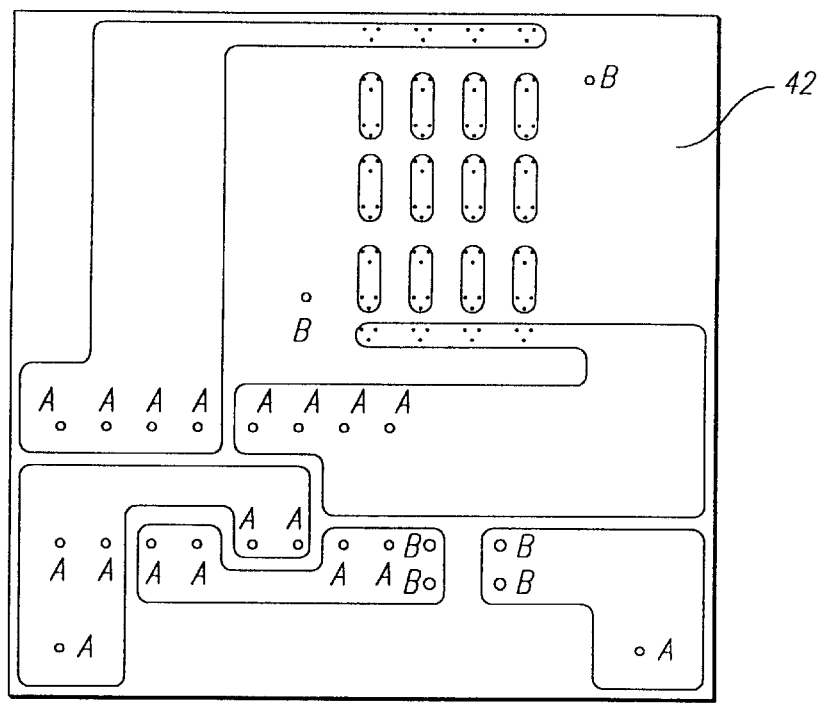
FIG. 22 is plan view of the main PCB of FIG. 21 depicting junction pads and trace paths, for clarity, suppressor cells are not shown.
Figure 23:
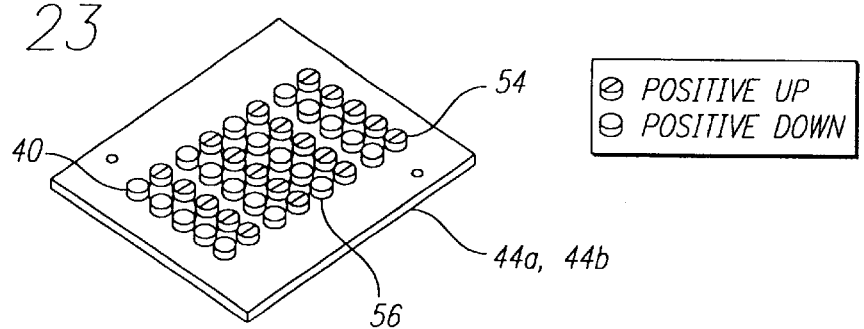
FIG. 23 is an isometric view of either a first-layer PCB subassembly or a mid-layer PCB subassembly of FIG. 22a depicting the arrangement and orientation of suppressor cells.

A suppressor assembly 26 is formed from a group of PCB subassemblies 42, 44a, 44b, 46 which are assembled under a controlled process. One of the unique features of modules assembled in accordance with the invention is that a group of PCB subassemblies 42, 44a, 44b, 46 may be stacked vertically, as shown in FIG. 21, and bonded together with components added as required. In addition, assemblies may be potted using various materials to protect from shock and provide thermal conduction for the suppressor.

Following is a list of materials, and material requirements, which may be used to manufacture a SPM:

| Circuit boards: | |
| --- | --- |
| Board material: | Laminated glass epoxy sheet, copper clad |
| Components: | |
| Diodes: | Silicon avalanche suppressor diodes in cell form. |
| Rectifier diodes: | Silicon rectifier blocking diodes in cell form. |
| Resistors: | Standard electronic components used. |
| LEDs: | Standard electronic components used. |
| Relays: | Standard electronic components used. |
| Miscellaneous: | Standard electronic components used. |

While the present invention has thus far been described within the context of surge protective devices for use in power or signaling systems, it may also find application in other electrical systems which operate in environments which render such systems relatively vulnerable to the deleterious effects of electrical transients. Such systems include control circuitry, computers and other circuits employing semiconductor devices. The present invention is of benefit to such systems as described in U.S. Pat. Nos. 3,475,653; 3,573,550 and 4,797,773, the disclosures of which are hereby incorporated by reference.

While several particular forms of the invention have been illustrated and described, it will be apparent that various modifications can be made without departing from the spirit and scope of the invention. Accordingly, it is not intended that the invention be limited, except as by the appended claims.

What is claimed is:

1. An electrical component assembly comprising:
    a first printed circuit board (PCB) having a plurality of first-PCB conductive paths communicating with at least one surface of said first PCB;
    at least one additional PCB having a plurality of additional-PCB conductive paths communicating with at least one surface of said additional PCB, said first-PCB conductive paths and said additional-PCB conductive paths located such that when said at least one additional PCB and said first PCB are positioned so that one PCB overlies the other, said first-PCB conductive paths and said additional-PCB conductive paths are substantially aligned;
    a plurality of electrical circuit components, each electrically connected to one of either of said first-PCB conductive paths and said additional-PCB conductive paths at one end and to another of either of said first-PCB conductive paths and said additional-PCB conductive paths at the other end; and
    at least one trace conductive path connecting at least two of either of said first-PCB conductive paths and said additional-PCB conductive paths.

2. The electrical component assembly of claim 1 wherein said first-PCB conductive paths and said additional-PCB conductive paths comprise at a least one solder-filled via passing through said PCB.

3. The electrical component assembly of claim 2 wherein said first-PCB conductive paths and said additional-PCB conductive paths further comprise at least one electrically-conductive junction pad communicating with said solder-filled via, said junction pad positioned at the surface of said PCB.

4. The electrical component assembly of claim 3 wherein said junction pad is substantially flush with the surface of said PCB.

5. The electrical component assembly of claim 1 wherein said at least one trace conductive path is carried on the surface of one of said PCBs.

6. The electrical component assembly of claim 1 wherein said at least one trace conductive path configures a plurality of said electrical components in a series arrangement.

7. The electrical component assembly of claim 1 wherein said at least one trace conductive path configures a plurality of said electrical components in a parallel arrangement.

8. The electrical component assembly of claim 1 wherein said electrical components include diodes.

9. The electrical component assembly of claim 8 wherein said diodes are unipolar diodes.

10. The electrical component assembly of claim 8 wherein said diodes are bipolar diodes.

11. The electrical component assembly of claim 1 wherein said electrical components include metal-oxide varistors.

12. The electrical component assembly of claim 1 wherein said electrical components include capacitors.

13. The electrical component assembly of claim 1 wherein said electrical circuit components are positioned between said PCBs and connected through said first-PCB conductive paths, said additional-PCB conductive paths and said trace conductive paths so as to provide a selectively tailored impedance verses frequency characteristic enabling filtering of undesired noise at frequencies selected for individual applications utilizing said assembly.

14. A surge protective device for electrical circuitry comprising:
    first and second terminals for connection to the power and/or signal terminals of a circuit being protected;
    a first printed circuit board (PCB) having a plurality of first-PCB conductive paths communicating with at least one surface of said first PCB;
    at least one additional PCB having a plurality of additional-PCB conductive paths communicating with at least one surface of said additional PCB, said first-PCB conductive paths and said additional-PCB conductive paths located such that when said at least one additional PCB and said first PCB are positioned so that one PCB overlies the other, said first-PCB conductive paths and said additional-PCB conductive paths are substantially aligned;
    a plurality of electrical circuit components, each electrically connected to one of either of said first-PCB conductive paths and said additional-PCB conductive paths at one end and to another of said first-PCB conductive paths and said additional-PCB conductive paths at the other end; and
    a plurality of trace conductive paths connecting selected said first-PCB conductive paths and said additional-PCB conductive paths, said first-PCB conductive paths, said additional-PCB conductive paths and said trace conductive paths connecting said electrical circuit components to provide a means for clamping the voltage across said first and second terminals to a characteristic voltage when energized and an energizing circuit having a predetermined voltage threshold of conduction.

15. The electrical component assembly of claim 14 wherein said first-PCB conductive paths and said additional-PCB conductive paths comprise at a least one solder-filled via passing through said PCB.

16. The electrical assembly of claim 15 wherein said first-PCB conductive paths and said additional-PCB conductive paths further comprise at least one electrically-conductive junction pad communicating with said solder-filled via, said junction pad positioned at the surface of said PCB.

17. The electrical component assembly of claim 16 wherein said junction pad is substantially flush with the surface of said PCB.

18. A surge protective device coupled between power and/or signal lines, said device comprising:
- a first printed circuit board (PCB) having a plurality of first-PCB conductive paths communicating with at least one surface of said first PCB;
- at least one additional PCB having a plurality of additional-PCB conductive paths communicating with at least one surface of said additional PCB, said first-PCB conductive paths and said additional-PCB conductive paths located such that when said at least one additional PCB and said first PCB are positioned so that one PCB overlies the other, said first-PCB conductive paths and said additional-PCB conductive paths are substantially aligned;
- a plurality of electrical circuit components, each electrically connected to one of either of said first-PCB conductive paths and said additional-PCB conductive paths at one end and to another of either of said first-PCB conductive paths and said additional-PCB conductive paths at the other end; and
- a plurality of trace conductive paths connecting selected said first-PCB conductive paths and said additional-PCB conductive paths, said first-PCB conductive paths, said additional-PCB conductive paths and said trace conductive paths connecting said electrical circuit components to provide a means for clamping the voltage across said power and/or signal lines to a predetermined voltage.

19. The electrical component assembly of claim 18 wherein said first-PCB conductive paths and said additional-PCB conductive paths comprise at a least one solder-filled via passing through said PCB.

20. The electrical assembly of claim 19 wherein said first-PCB conductive paths and said additional-PCB conductive paths further comprise at least one electrically-conductive junction pad communicating with said solder-filled via, said junction pad positioned at the surface of said PCB.

21. The electrical component assembly of claim 20 wherein said junction pad is substantially flush with the surface of the printed circuit board.

* * * * *